United States Patent [19]
Grivna et al.

[11] Patent Number: 5,641,712
[45] Date of Patent: Jun. 24, 1997

[54] METHOD AND STRUCTURE FOR REDUCING CAPACITANCE BETWEEN INTERCONNECT LINES

[75] Inventors: Gordon M. Grivna, Mesa; Karl J. Johnson, Scottsdale; Bruce A. Bernhardt, Chandler, all of Ariz.

[73] Assignee: Motorola, Inc., Schaumburg, Ill.

[21] Appl. No.: 512,253

[22] Filed: Aug. 7, 1995

[51] Int. Cl.⁶ ................................................. H01L 21/28
[52] U.S. Cl. .................. 438/624; 204/192.37; 438/619; 438/699; 438/626
[58] Field of Search ................ 437/30, 64, 65, 437/187, 195, 228, 238; 204/192.32, 192.37

[56] References Cited

U.S. PATENT DOCUMENTS

| | | | |
|---|---|---|---|
| 4,874,493 | 10/1989 | Pan | 437/228 |
| 5,001,079 | 3/1991 | Van Learhoven et al. | 437/50 |
| 5,107,320 | 4/1992 | Iranmanesh | 557/34 |
| 5,192,715 | 3/1993 | Sliwa, Jr. et al. | 437/195 |
| 5,278,083 | 1/1994 | Hill et al. | 437/31 |
| 5,310,700 | 5/1994 | Lien et al. | 437/195 |
| 5,324,683 | 6/1994 | Fitch et al. | 437/65 |
| 5,407,860 | 4/1995 | Stoltz et al. | 437/195 |
| 5,461,003 | 10/1995 | Havemann et al. | 437/64 |
| 5,599,745 | 2/1997 | Reinberg | 437/195 |

FOREIGN PATENT DOCUMENTS

| | | |
|---|---|---|
| 63-098134 | 4/1988 | Japan. |
| 2-151032 | 6/1990 | Japan. |

OTHER PUBLICATIONS

Shin–Puu Jen et al., IEEE, 1994 Symposium on VLSI Technology Digest of Technical Papers, "A Planarized Multilevel Interconnect Scheme With Embedded Low–Dielectric–Constant Polymers For Sub–Quarter–Micron Applications", Apr. 1994, pp. 73–74.

*Primary Examiner*—John Niebling
*Assistant Examiner*—Thomas G. Bilodeau
*Attorney, Agent, or Firm*—Joe E. Barbee; George C. Chen

[57] ABSTRACT

A method and structure for reducing capacitance between interconnect lines (11, 24, 26) utilizes air gaps (17, 47) between the interconnect lines (11, 24, 26). Deposited over the interconnect lines (11, 24, 26), a silane oxide layer (14) forms a "breadloaf" shape which can be sputter etched to seal the air gaps (17, 47). Prior to the deposition of the sputter etched silane oxide layer (14), spacers (13, 42, 43) can be formed around the interconnect lines (11, 24, 26) to increase the aspect ratio of gaps (23, 31) between the interconnect lines (11, 24, 26) which facilitates the formation of the "breadloaf" shape of the silane oxide layer (14).

20 Claims, 1 Drawing Sheet

METHOD AND STRUCTURE FOR REDUCING CAPACITANCE BETWEEN INTERCONNECT LINES

BACKGROUND OF THE INVENTION

This invention relates, in general, to a method of fabricating an interconnect structure, and more particularly, to a method of reducing capacitance between interconnect lines.

With the constant push towards shrinking the size of semiconductor integrated circuits (ICs), semiconductor device geometries and interconnect lines connecting the semiconductor devices must be reduced. Furthermore, the spacing between interconnect lines must also be reduced to fully achieve smaller semiconductor ICs. However, as the spacing between interconnect lines is reduced to the micron and submicron range, a parasitic intra-level capacitance between the interconnect lines increases. Consequently, it becomes increasingly important to reduce the capacitance between interconnect lines to minimize cross-talk between the interconnect lines and to minimize decreases in semiconductor device speed. In fact, in many cases, the intra-level capacitance of metal interconnect lines has become the limiting factor in determining the speed of many gallium arsenide and silicon ICs.

One approach to reduce the intra-level capacitance increases the spacing between the interconnect lines. However, this proposed solution is not compatible with the original goal of shrinking the size of semiconductor ICs.

A second approach to reduce the intra-level capacitance uses a low dielectric constant material between the interconnect lines, and a third approach deposits a first dielectric layer, etches away the initial dielectric material deposited between the interconnect lines, and refills the etched away portion with a different low dielectric constant polymer. For example, conventionally used CVD oxide has a relative dielectric constant of approximately 4.6, and fluorine doped oxides and organic dielectrics have lower relative dielectric constants of approximately 3.3 and 2.6, respectively.

The second and third proposed solutions produce detrimental side effects and may not sufficiently reduce the intra-level capacitance. With the use of increasingly small spacings between the interconnect lines, the low dielectric constants of many dielectric materials are often not low enough to significantly reduce the parasitic intra-level capacitance. Moreover, the process steps associated with incorporating these dielectrics into a conventional process flow are time consuming, complicated, and expensive. The resulting interconnect structures also may reduce the efficiency of heat dissipation since materials having lower dielectric constants generally have lower thermal conductivity. Furthermore, the resulting interconnect structures create other reliability problems which include, but are not limited to, moisture absorption, adhesion failures, and mechanical stress failures.

Accordingly, a need exists for a method of reducing capacitance between interconnect lines. The method should not be expensive, should not significantly increase the cycle time of the process flow, should not impede thermal dissipation, should not be complicated, and should be compatible with shrinking the size of semiconductor ICs.

DETAILED DESCRIPTION OF THE DRAWINGS

When depositing a dielectric layer, a conventional approach minimizes the formation of voids or air gaps formed between interconnect features. This void minimization is typically performed to eliminate weak "seams" or areas where sealed voids are opened up during subsequent processing steps such as planarization or the like. The minimization of void formation was considered necessary because, among other reasons, the voids between the interconnect features extended above the height of the interconnect features, and the sealed voids were opened up while removing an upper portion of the dielectric during planarization of the dielectric. The opened voids create reliability issues, extreme non-planarity which is incompatible with multi-layer-metal (MLM) schemes, and various other problems.

The present invention discloses a "seam free" method which reduces intra-level capacitance by increasing the size of the voids between interconnect and other features and by positioning the void between the features and below a desired planarization height. The method described below can reduce intra-level capacitance by over thirty percent without using an expensive process, without significantly increasing the cycle time or the complexity of the process, and does not create additional thermal dissipation issues.

Figure 1:
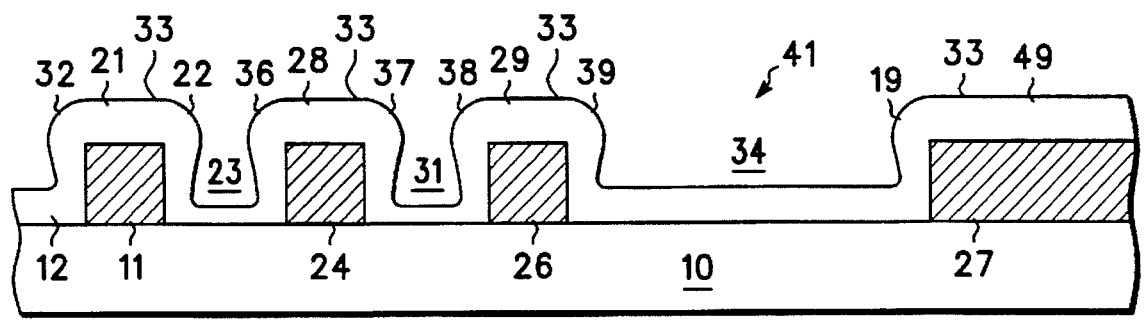
FIGS. 1–5 illustrate cross-sections of process steps for fabricating an interconnect structure having reduced capacitance between interconnect lines in accordance with the present invention.

Turning to the figures for a more detailed description of the present invention, FIG. 1 illustrates a cross-section of a first process step for fabricating an interconnect structure having reduced capacitance between interconnect lines in accordance with the present invention. FIG. 1 portrays an interconnect structure 41 of a semiconductor chip 48 having interconnect lines 11, 24, 26, and 27 disposed over a substrate 10. Semiconductor chip 48 is part of a semiconductor wafer. Interconnect lines 11, 24, 26, and 27 are formed using conventional processes and preferably comprise conventional interconnect material including, but not limited to copper, aluminum, silicon, titanium, tungsten, gold, tin, and lead. Interconnect lines 11 and 24 are separated by gap 23. Similarly, gap 31 exists between interconnect lines 24 and 26, and gap 34 exists between interconnect lines 26 and 27. As shown in FIG. 1, gap 34 has a smaller aspect ratio compared to gaps 23 and 31. The aspect ratio is a ratio of a height of a gap over a width of the gap.

Substrate 10 comprises any semiconducting materials such as silicon, silicon germanium, silicon carbide, gallium arsenide, indium phosphide, or the like. Substrate 10 contains semiconductor devices (not shown) and can also contain other interconnect features and electrically insulating dielectrics. Substrate 10 may also comprise other insulating materials, inorganic materials, or organic materials. Interconnect lines 11, 24, 26, and 27 are electrically coupled to the semiconductor devices and other interconnect features of substrate 10.

A dielectric layer 12 is disposed over interconnect lines 11, 24, 26, and 27 and substrate 10 as illustrated in FIG. 1. Dielectric layer 12 is any electrically insulating material such as nitride but is preferably an oxide formed from a silane source gas using a chemical vapor deposition (CVD) process. Dielectric layer or electrically insulating layer 12 is preferably formed from the silane source gas in a CVD process due to its low cost and due to its ability of forming a "breadloaf" shape as indicated by breadloaves 21, 28, 29, and 49. Carrier gases such as nitrous oxide, helium, or the like can be used with the silane source gas.

Corners 32 and 22 of breadloaf 21, corners 36 and 37 of breadloaf 28, corners 38 and 39 of breadloaf 29, and corner 19 of breadloaf 49 are formed as a result of a phenomenon known as mass transport. Due to mass transport, more silane source gas is available at an upper surface of interconnect structure 41 indicated by region 33 compared to a lower surface of interconnect structure 41 at gaps 23, 31, and 34. Because less silane source gas is available at gaps 23, 31, and 34, less oxide will be deposited in gaps 23, 31, and 34 compared to region 33. Consequently, breadloaves 21, 28, 29, and 49 are formed over interconnect lines 11, 24, 26, and 27, respectively, which tend to narrow gaps 23, 31, and 34 but do not completely fill in gaps 23, 31, and 34.

It is important to note that more dielectric is deposited in gap 34 compared to gaps 23 and 31. This phenomenon occurs because gap 34 has a smaller aspect ratio than gaps 23 and 31 and, therefore, does not restrict the flow of the silane source gas as much as gaps 23 and 31. Furthermore, while a central portion of gap 34 may not restrict the flow of the silane source gas, the flow of the silane source gas is partially restricted along edge portions of gap 34 which creates corners 39 and 19 of breadloaves 29 and 49, respectively.

Figure 2:
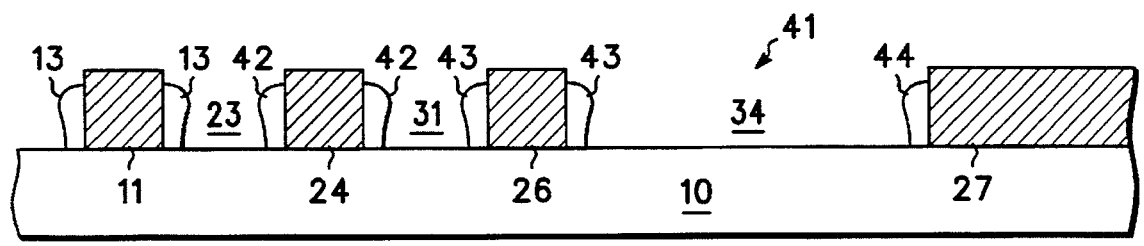

Continuing with FIG. 2, dielectric layer 12 is anisotropically etched to remove a top portion of dielectric layer 12 to form spacers 13, 42, 43, and 44 around interconnect lines 11, 24, 26, and 27, respectively. Spacers 13, 42, 43, and 44 increase the aspect ratio of gaps 23, 31, and 34. If dielectric layer 12 comprises the preferred silane oxide, the anisotropic etch is preferably a reactive ion etch (RIE) comprising reactive gases such as CF4, CHF3, C2F6, or the like and also comprising carrier gases including, but not limited to, helium and nitrogen. The anisotropic etch can be timed or endpointed and, although not shown in FIG. 2, can include an overetch to recess gaps 23, 31, and 34 into substrate 10.

After the anisotropic etch step, a wet etch, ash, or other similar process can be used to remove residues from the anisotropic etch step. Because the residues are mainly comprised of carbon, an organic strip should be used at this step.

Figure 3:
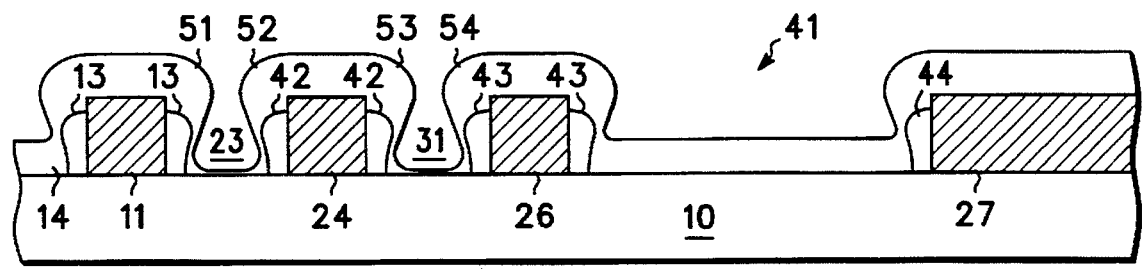

Referring now to FIG. 3, an additional deposition process provides an electrically insulating layer or dielectric layer 14 over spacers 13, 42, 43, and 44, interconnect lines 11, 24, 26, and 27, and substrate 10. Dielectric layer has edges or corners 51, 52, 53, and 54. Similar to dielectric layer 12, a silane source gas is preferably used to deposit oxide for dielectric layer 14 for at least the same two reasons as mentioned previously: low cost and the ability to form a breadloaf shape. Nitrides and other electrically insulating materials can be used in place of the silane oxide; however, nitrides have a higher dielectric constant which is undesirable, and other forms of oxide are more conformal and may not form the preferred breadloaf shape.

As depicted in FIG. 3, gaps 23 and 31 are nearly sealed by dielectric layer 14, but at least a portion of gaps 23 and 31 are not filled in by dielectric layer 14. Because the aspect ratio of gaps 23 and 31 are higher in FIG. 3 compared to FIG. 1, the breadloafing phenomenon occurs more quickly during the deposition process of FIG. 3.

Figure 4:
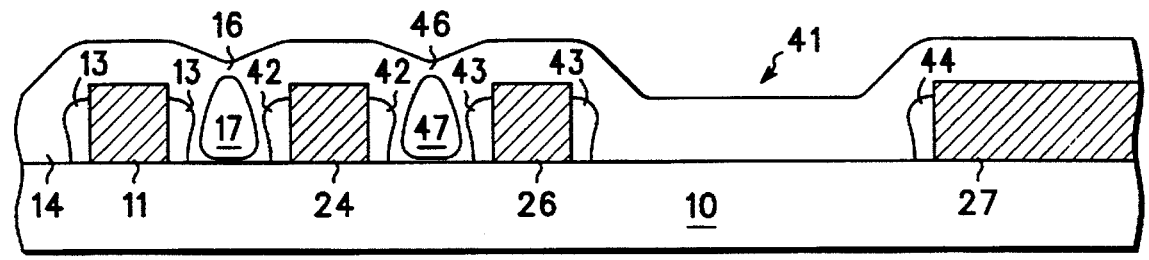

Turning to FIG. 4, an etch, which is preferably a sputter etch, is used to form voids or air gaps 17 and 47 which have seams 16 and 46, respectively, and to provide a maximum void height below the subsequent planarization level. Voids 17 and 47 can contain gases comprising the ambient atmosphere of the sputter etch process. The presence of voids 17 and 47 permits the utilization of air as an intra-level dielectric which has the relative dielectric constant of 1.0 which is much lower than the relative dielectric constants of other conventional dielectrics.

An inert ion such as argon or the like can be used as the sputtering ion during the sputter etch step. The sputter etch physically bombards dielectric layer 14 with argon ions which sputter or remove exposed portions of dielectric layer 14. Dielectric material at corners 51, 52, 53, and 54 of dielectric layer 14 will be sputtered away faster compared to the dielectric material at flat surfaces of dielectric layer 14. The sputter etch redistributes a portion of dielectric layer 14 to form seams 16 and 46. More specifically, the sputter etch sputters or removes dielectric material from corners 51 and 52 of dielectric layer 14 of FIG. 3 and re-deposits a portion of the sputtered dielectric material to form seam 16 of FIG. 4. Similarly, the argon sputter etch displaces or dislodges material from corners 53 and 54 of FIG. 3 and transfers or redistributes a portion of the displaced material to form seam 46. In sputtering corners 51, 52, 53, and 54, the sputter etch tapers corners 51, 52, 53, and 54 and other corners of the breadloaves of dielectric layer 14 to prevent the formation of additional and undesirable voids during subsequent dielectric and other layer depositions. Preferably tapered to an approximate 45 degree angle as shown in FIG. 4, the corners of dielectric layer 14 also aid in making the subsequent deposition of a dielectric layer substantially conformal.

Prior to the argon sputter etch of FIG. 4, baking or exposing interconnect structure 41 to an elevated temperature can be used to drive out moisture from gaps 23 and 31 which form voids 17 and 47, respectively. The baking is preferably performed insitu in a low pressure environment. By removing moisture from gaps 23 and 31, the reliability of voids 17 and 47 and interconnect structure 41 is improved. Similarly, an elevated temperature bake can be used after the spacer formation of FIG. 2 and before deposition of dielectric layer 14 of FIG. 3 and can also be used prior to any other process step where a void is sealed.

If gaps 23 and 31 of FIG. 3 had higher aspect ratios than depicted in FIG. 3, gaps 23 and 31 could be sealed to form voids 17 and 47, respectively, during the deposition of dielectric layer 14. In other words, corners 51 and 52 would contact each other to form seam 16 of void 17, and corners 53 and 54 would contact each other to form seam 46 of void 47 during deposition of dielectric layer 14. The sputter etch of FIG. 4 would be used to strengthen seams 16 and 46 by redistributing a portion of dielectric layer 14 as described above.

Figure 5:
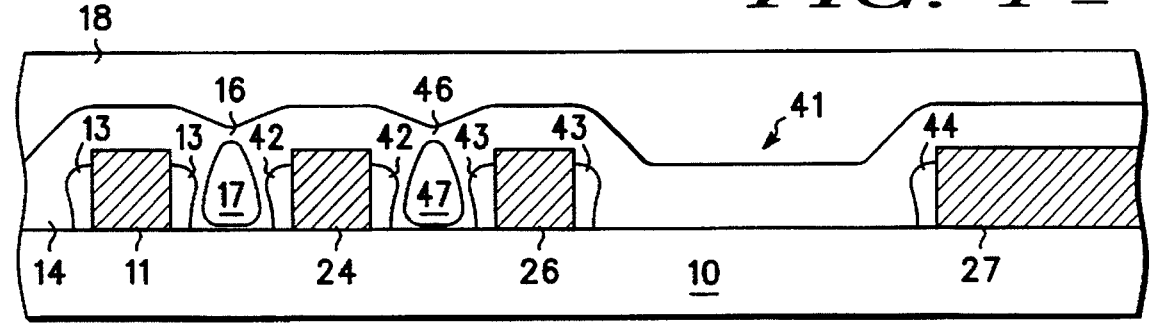

Finally, in FIG. 5, electrically insulating layer or dielectric layer 18 is disposed over dielectric layer 14 and is conventionally planarized if necessary. As mentioned previously, the sputter etch of FIG. 4 reshapes the corners of dielectric layer 14 to aid in the conformal deposition of dielectric layer 18. Planarization of dielectric layer 18 does not open up but rather maintains voids 17 and 47. The planarization step provides a substantially planar surface over which additional layers of interconnect can be formed to increase the functionality of both interconnect structure 41 and semiconductor chip or semiconductor structure 48. A planar surface is essential for fabricating a high yielding and reliable MLM structure. The sputter etch step of FIG. 4 also rounds the corners of dielectric layer 14 which prevent the formation of undesirable voids during deposition of dielectric layer 18 in FIG. 5. Furthermore, the deposition of dielectric layer 18 creates a hermetic seal for voids 17 and 47.

While voids 17 and 47 may be poor thermal conductors, heat transfer efficiency through interconnect structure 41 is maintained because voids 17 and 47 are not a significant portion of interconnect structure 41. Therefore, heat can still be efficiently dissipated through interconnect lines 11, 24, 26, and 27, spacers 13, 42, 43, and 44, and the underlying dielectric layer.

After planarization of dielectric layer 18, the process steps of FIGS. 1–5 can be repeated for additional interconnect layers thereby reducing the intra-level capacitance of the additional interconnect layers.

Many alternative embodiments of the above described method and structure exist, and a few are described below. For example, if an overetch was used after the anisotropic etch of FIG. 2 to recess gaps 23 and 31, voids 17 and 47 will be larger compared to when the overetch was not used. Because voids 17 and 47 would now extend into substrate 10 and below interconnect lines 11, 24, 26, and 27, voids 17 and 47 can also reduce the fringing capacitance component of the intra-level capacitance.

Additionally, interconnect lines 11, 24, 26, and 27 can be used as posts for a posted inductor as conventionally used in radio frequency (rf) gallium arsenide circuits and other high frequency applications. The method or process of the present invention can replace the technique of using air bridges as known in the art.

Furthermore, interconnect lines or features 11, 24, 26, and 27 can also represent dielectric features comprising materials such as oxide, nitride, or the like. In this manner, inter-level capacitance, instead of intra-level capacitance, of an interconnect structure can be reduced. For example, if an overlaying interconnect layer were above features 11, 24, 26, and 27 and an underlying interconnect layer were below features 11, 24, 26, and 27, voids 17 and 47 would serve to reduce the inter-level capacitance which is the capacitance between the overlaying and underlying interconnect layers. The voids in the inter-layer dielectric, which is the dielectric layer between the overlaying and underlying interconnect layers of this alternative embodiment, would preferably be placed between an interconnect line of the overlaying interconnect layer and a different interconnect line of the underlying layer to most effectively reduce inter-level capacitance.

In another embodiment of the present invention, if the aspect ratio of gaps 23 and 31 between interconnect lines 11, 24, and 26 is large enough, the process steps of FIGS. 1 and 2 may not be needed. In other words, spacer formation around interconnect lines is not required if the subsequently deposited dielectric layer can form breadloaves which have large enough corners and which are close enough together to be sealed during a sputter etch or during a dielectric deposition. Similarly, if the aspect ratio between interconnect lines is very small, additional spacers may be required to be formed over the existing spacers of FIG. 2 to increase the aspect ratio to an appropriate value.

Therefore, in accordance with the present invention, it is apparent there has been provided an improved method of reducing capacitance between interconnect lines which overcomes the disadvantages of the prior art. The present invention is inexpensive and uncomplicated, can easily be integrated into conventional process flows without significantly increasing cycle time, maintains heat transfer efficiency through the interconnect structure, and is compatible with reducing the size of semiconductor integrated circuits.

We claim:

1. A method of reducing capacitance between interconnect lines, the method comprising:

providing a substrate;

disposing interconnect lines over the substrate;

forming spacers around the interconnect lines;

disposing a first electrically insulating layer over the spacers and the interconnect lines; and etching the first electrically insulating layer to seal at least one air gap between the interconnect lines.

2. The method according to claim 1, further comprising:

disposing a second electrically insulating layer over the first electrically insulating layer after the etching step; and planarizing the second electrically insulating layer.

3. The method according to claim 2, wherein the planarizing step further includes keeping the at least one air gap sealed.

4. The method according to claim 1, further including selecting the substrate from the group consisting of semi-conducting materials and insulating materials.

5. The method according to claim 1, further including selecting the interconnect lines from the group consisting of copper, aluminum, silicon, titanium, tungsten, gold, tin, and lead.

6. The method according to claim 1, wherein the forming step further comprises:

disposing a second electrically insulating material over the interconnect lines; and etching the second electrically insulating material to form the spacers.

7. The method according to claim 1, further including ashing the spacers.

8. The method according to claim 1, further including using silane to deposit oxide for the spacers and the first electrically insulating layer.

9. The method according to claim 1, wherein the etching step further comprises using a sputter etch.

10. The method according to claim 1, further including baking the substrate.

11. A method of forming an air gap between a first feature and a second feature, the method comprising:

providing a substrate;

forming the first feature and the second feature over the substrate, the first feature and the second feature forming a gap between the first feature and the second feature;

providing a layer over the first feature and the second feature, wherein at least a portion of the gap remains between the first feature and the second feature; and sealing the gap between the first feature and the second feature to form the air gap by etching the layer.

12. The method according to claim 11, further comprising forming a first spacer around the first feature and a second spacer around the second feature.

13. The method according to claim 11, wherein the forming step further includes using silane to deposit oxide for the layer.

14. The method according to claim 11, wherein the sealing step further includes sputtering etching the layer.

15. The method according to claim 11, further comprising baking the substrate.

16. A method of forming a void over a substrate, the method comprising:

providing a substrate;

forming at least two features over the substrate;

depositing a first dielectric layer over the at least two features;

anisotropically etching the first dielectric layer to form spacers around the at least two features;

removing residues from the anisotropically etching step;

depositing a second dielectric layer over the at least two features and the spacers;

sputter etching the second dielectric layer to create a void between the at least two features;

depositing a third dielectric layer over the second dielectric layer.

17. The method according to claim 16, wherein the forming step further comprises forming the at least two features from materials selected from the group consisting of copper, aluminum, silicon, titanium, tungsten, gold, tin, lead, oxide, and nitride.

18. The method according to claim 16, wherein the removing step further comprises ashing.

19. The method according to claim 16, further comprising using silane oxide for the first and second dielectric layers.

20. The method according to claim 16, further comprising planarizing the third dielectric layer while maintaining the void between the at least two features.

* * * * *